(12) United States Patent
Kim et al.

(10) Patent No.: US 9,553,275 B2
(45) Date of Patent: Jan. 24, 2017

(54) FLEXIBLE DISPLAY PANEL AND METHOD OF MANUFACTURING THE SAME

(71) Applicant: Samsung Display Co., Ltd., Yongin-si, Gyeonggi-do (KR)

(72) Inventors: Kwangmin Kim, Yongin-si (KR); Wonkyu Kwak, Yongin-si (KR); Hyejin Shin, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/859,039

(22) Filed: Sep. 18, 2015

(65) Prior Publication Data

US 2016/0308151 A1    Oct. 20, 2016

(30) Foreign Application Priority Data

Apr. 16, 2015   (KR) .................... 10-2015-0053772

(51) Int. Cl.
| | | |
|---|---|---|
| *H01L 33/00* | (2010.01) | |
| *H01L 51/00* | (2006.01) | |
| *H01L 27/32* | (2006.01) | |
| *H01L 51/52* | (2006.01) | |
| *H01L 51/56* | (2006.01) | |

(Continued)

(52) U.S. Cl.
CPC ....... *H01L 51/0097* (2013.01); *H01L 27/3276* (2013.01); *H01L 51/5253* (2013.01); *H01L 51/56* (2013.01); *H01L 25/0753* (2013.01); *H01L 33/20* (2013.01); *H01L 33/486* (2013.01); *H01L 33/62* (2013.01); *H01L 2227/323* (2013.01)

(58) Field of Classification Search
CPC ............. H01L 51/0097; H01L 27/3276; H01L 51/5253; H01L 51/56; H01L 25/0753; H01L 33/62; H01L 33/20; H01L 33/486; H01L 2924/01079; H01L 33/32; H01L 33/38; H01L 2227/323; H01L 27/323; H01L 51/5281; H01L 51/5338
USPC .................... 257/88, 40, 79, 99; 438/22, 24
See application file for complete search history.

(56) References Cited

U.S. PATENT DOCUMENTS

| | | | |
|---|---|---|---|
| 2013/0037792 A1* | 2/2013 | Kim | ................... H01L 51/5256 257/40 |
| 2014/0097408 A1 | 4/2014 | Kim et al. | |

(Continued)

FOREIGN PATENT DOCUMENTS

| | | |
|---|---|---|
| KR | 10-2014-0045193 A | 4/2014 |
| KR | 10-2014-0118676 A | 10/2014 |

(Continued)

*Primary Examiner* — Thinh T Nguyen
(74) *Attorney, Agent, or Firm* — Knobbe, Martens, Olson & Bear, LLP

(57) ABSTRACT

A flexible display panel and a method of manufacturing the same are disclosed. In one aspect, the flexible display panel includes a flexible substrate including a bending area, a display unit formed over the flexible substrate, and a thin film encapsulation layer covering the display unit. The flexible display panel further includes a wiring layer electrically connected to the display unit and formed over the bending area and a stress-neutralizing layer formed over the flexible substrate. The stress-neutralizing layer is configured such that a compressive stress is applied to the wiring layer when the bending area is bent. The stress-neutralizing layer includes a layer formed of the same material as the thin film encapsulation layer.

11 Claims, 4 Drawing Sheets

(51) Int. Cl.
    *H01L 33/62*     (2010.01)
    *H01L 33/20*     (2010.01)
    *H01L 33/48*     (2010.01)
    *H01L 25/075*     (2006.01)

(56) References Cited

U.S. PATENT DOCUMENTS

2014/0354558 A1    12/2014    Cho et al.
2015/0049428 A1*    2/2015    Lee ........................ G06F 1/1641
                                                                     361/679.27

FOREIGN PATENT DOCUMENTS

KR    10-2014-0141380 A    12/2014
KR    10-2015-0002118 A    1/2015

* cited by examiner

FLEXIBLE DISPLAY PANEL AND METHOD OF MANUFACTURING THE SAME

RELATED APPLICATION

This application claims the benefit of Korean Patent Application No. 10-2015-0053772, filed on Apr. 16, 2015, in the Korean Intellectual Property Office, the disclosure of which is incorporated herein in its entirety by reference.

BACKGROUND

Field

The described technology generally relates to a flexible display panel and a method of manufacturing the flexible display panel.

Description of the Related Technology

Flexible display panels include a flexible substrate and a display unit formed thereon for displaying images. Flexible display panels have advantageous characteristics over rigid display panels in that they can be partially bent as needed.

Flexible display panels further include a wiring layer for providing electrical signals to the display unit for displaying the images. When the flexible display panel is bent, the integrity of the wiring layer must be maintained without forming any cracks therein.

SUMMARY OF CERTAIN INVENTIVE ASPECTS

One inventive aspect is a flexible display panel and a method of manufacturing the flexible display panel.

Additional aspects will be set forth in part in the description which follows and, in part, will be apparent from the description, or may be learned by practice of the presented embodiments.

Another aspect is a flexible display panel including a flexible substrate including a bending area, a display unit provided on the flexible substrate, a thin film encapsulation layer covering the display unit, a wiring layer connected to the display unit over the bending area, and a stress-neutralizing layer provided in the flexible substrate such that a compressive stress is applied to the wiring layer in the bending area, wherein the stress-neutralizing layer includes a layer formed of the same material as that of the thin film encapsulation layer.

The thin film encapsulation layer can include an organic film, and the stress-neutralizing layer can include a layer formed of the same material as that of the organic film of the thin film encapsulation layer.

The thin film encapsulation layer can further include an inorganic film alternately stacked with the organic film.

A neutral surface that is a boundary of a tensile stress and a compressive stress in the bending area can be formed inside the stress-neutralizing layer.

Another aspect is a method of manufacturing a flexible display panel forming a display unit forming an image on the flexible substrate, and a wiring layer providing an electrical signal to the display unit over a bending area of the flexible substrate; forming a thin film encapsulation layer covering the display unit; and forming a stress-neutralizing layer formed of the same material as that of the thin film encapsulation layer such that a compressive stress is applied to the wiring layer in the bending area.

The thin film encapsulation layer can include an organic film, and the stress-neutralizing layer can include a layer formed of the same material as that of the organic film of the thin film encapsulation layer.

The organic film of the thin film encapsulation layer and the stress-neutralizing layer can be formed using an inkjet process.

The thin film encapsulation layer can further include an inorganic film alternately stacked with the organic film.

A neutral surface that is a boundary of a tensile stress and a compressive stress in the bending area can be formed inside the stress-neutralizing layer.

Another aspect is a flexible display panel, comprising a flexible substrate including a bending area; a display unit formed over the flexible substrate; a thin film encapsulation layer covering the display unit; a wiring layer electrically connected to the display unit and formed over the bending area; and a stress-neutralizing layer formed over the flexible substrate and configured such that a compressive stress is applied to the wiring layer when the bending area is bent, wherein the stress-neutralizing layer comprises a layer formed of the same material as the thin film encapsulation layer.

In exemplary embodiments, the thin film encapsulation layer comprises an organic film and wherein the stress-neutralizing layer comprises a layer formed of the same material as the organic film of the thin film encapsulation layer. The thin film encapsulation layer can further comprise an inorganic film alternately stacked with the organic film. A neutral plane can be located within the stress-neutralizing layer, wherein the neutral plane defines a boundary between tensile stress and compressive stress in the bending area when the bending area is bent.

In exemplary embodiments, the flexible display panel further comprises a protection film formed below the flexible substrate, wherein the protection film does not overlap the bending area. The flexible display panel can further comprise a pad unit formed over the flexible substrate, wherein the bending area is interposed between the pad unit and the display unit with respect to the length of the flexible substrate and wherein the bending area is bent such that the pad unit at least partially overlaps the display unit.

Another aspect is a method of manufacturing a flexible display panel, comprising forming a display unit over a flexible substrate, wherein the display unit is configured to display an image; forming a wiring layer over a bending area of the flexible substrate, the wiring layer configured to transmit an electrical signal to the display unit; forming a thin film encapsulation layer so as to cover the display unit; and forming a stress-neutralizing layer over the wiring layer, wherein the stress-neutralizing layer is formed of the same material as the thin film encapsulation layer and wherein the stress-neutralizing layer is configured such that a compressive stress is applied to the wiring layer when the bending area is bent.

In exemplary embodiments, the thin film encapsulation layer comprises an organic film, and wherein the stress-neutralizing layer comprises a layer formed of the same material as the organic film of the thin film encapsulation layer. The organic film of the thin film encapsulation layer and the stress-neutralizing layer can be formed using an inkjet process. The thin film encapsulation layer can further comprise an inorganic film alternately stacked with the organic film. A neutral plane can be located within the stress-neutralizing layer, the neutral plane can define a boundary between tensile stress and compressive stress in the bending area when the bending area is bent.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF CERTAIN INVENTIVE EMBODIMENTS

Figure 1:
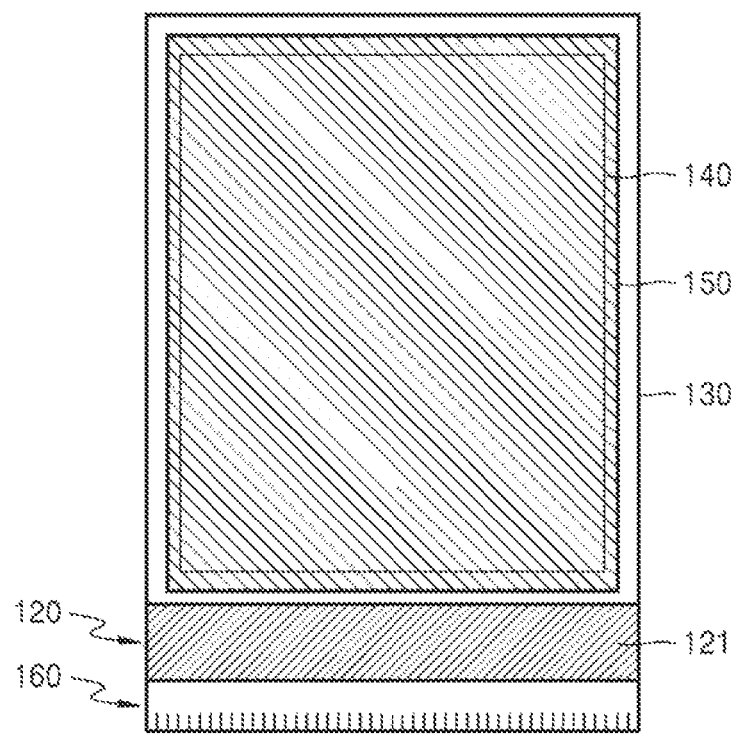
FIG. 1 is a plan view of a flexible display panel according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Hereinafter, the exemplary embodiments will be described in detail by explaining exemplary embodiments with reference to the attached drawings. Like reference numerals in the drawings denote like components, and thus their description will be omitted.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of components in the drawings may be exaggerated for the sake of clarity. In other words, since the sizes and thicknesses of components in the drawings may be exaggerated, the following embodiments are not limited thereto.

When certain embodiments may be implemented differently, the specific process order may be performed differently from the described order. For example, two consecutively described processes may be performed substantially at the same time or performed in an order opposite to the described order.

FIG. 1 is a plan view of a flexible display panel according to an exemplary embodiment.

As shown in FIG. 1, the flexible display panel of the present embodiment includes a flexible substrate 130, a display unit 140 formed on the substrate 130 and forming an image, a thin film encapsulation layer 150 covering the display unit 140 to protect the display unit 140, and a pad unit 160 provided on one side of the substrate 130 for an electrical connection with the display unit 140.

Figure 2:
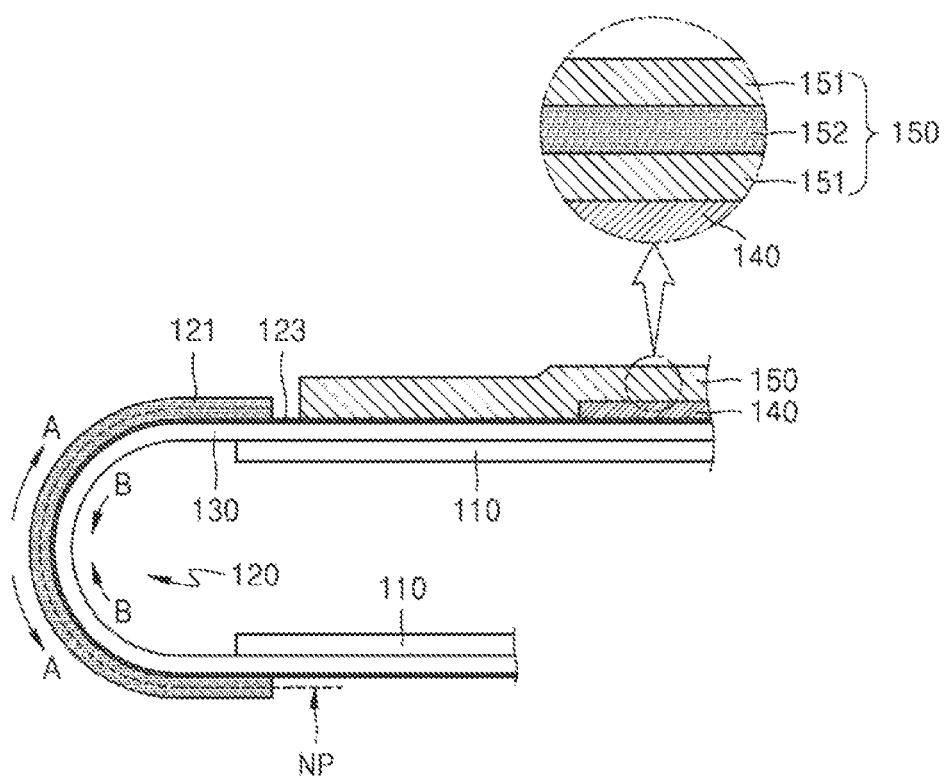
FIG. 2 is a lateral view of the flexible display panel of FIG. 1.

A bending area 120 can be provided between the display unit 140 and the pad unit 160. As described above, the flexible substrate 130 is used, and thus the bending area 120 can be bent as shown in FIG. 2. Reference numeral 110 of FIG. 2 denotes a protection film attached on a lower surface of the substrate 130.

Meanwhile, a stress-neutralizing layer 121 for neutralizing a location of a neutral surface or neutral plane NP can be formed in the bending area 120. The stress-neutralizing layer 121 can neutralize the location of the neutral surface or neutral plane NP (i.e., the neutral plane NP can be located within the neutralizing layer 121) such that a tensile stress A is not applied to a wiring layer 123 that electrically connects the display unit 140 to the pad unit 160. That is, the wiring layer 123 formed of a metal material that electrically connects the display unit 140 to the pad unit 160 and forms a path for an electrical signal in the bending area 120. If the tensile stress A is applied to the wiring layer 123, cracks may be easily formed. To prevent cracks from occurring, the neutral surface NP can be formed in the stress-neutralizing layer 121 by forming the stress-neutralizing layer 121 on the wiring layer 123 of the substrate 130, thereby applying a compressive stress B to the wiring layer 123.

In this regard, the neural surface NP refers to a surface to which no compressive stress or tensile stress is applied when the bending area 120 is bent. For example, if the bending area 120 is bent as shown in FIG. 2, the compressive stress B is applied to the inside of a bent curvature and the tensile stress A is applied to the outside thereof. Thus, the direction in which stress is applied is gradually changed from a compressive direction to a tensile direction closer to the outside of the curvature from the inside thereof. There is a threshold conversion point at which the compressive stress B and the tensile stress A are not applied, which is termed the neutral surface or neutral plane NP. When the location of the neutral surface NP is neutralized by the stress-neutralizing layer 121 (i.e., located within the stress-neutralizing layer 121) as described above, since the compressive stress B is applied to the wiring layer 123, the formation of cracks can be reduced.

The stress-neutralizing layer 121 can be formed of the same material as that of an organic film 152 of the thin film encapsulation layer 150 covering the display unit 140. That is, the thin film encapsulation layer 150 can have a structure in which an inorganic film 151 and the organic film 152 are alternately stacked. When the organic film 152 is formed, the stress-neutralizing layer 121 can be formed of an organic material in the bending area 120. Thus, no additional process for forming the stress-neutralizing layer 121 is required, thereby dramatically reducing the whole processing.

Figure 3:
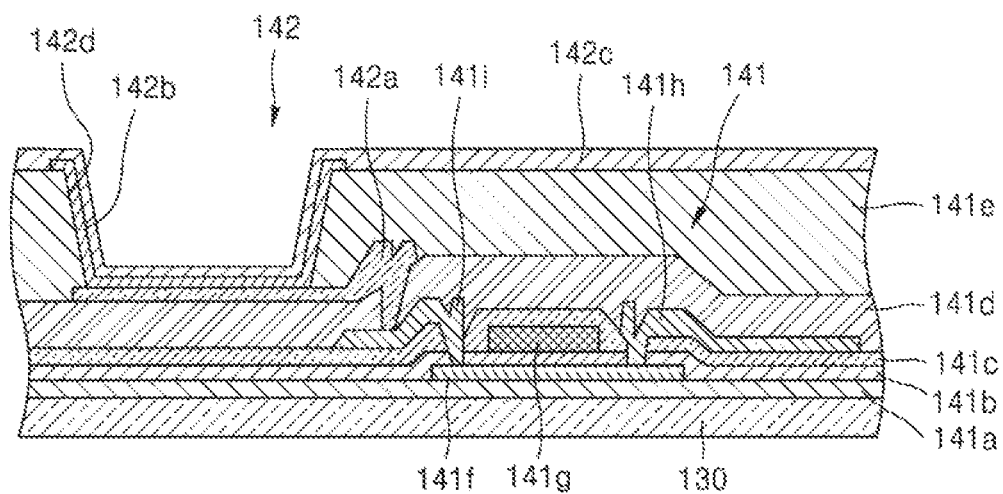
FIG. 3 is a cross-sectional view of the display unit of FIG. 2.

A manufacturing process will be described in detail later. Detailed structures of the display unit 140 and the bending area 120 will now be described with reference to FIG. 3. FIG. 3 is a cross-sectional view of the display unit of FIG. 2.

A thin film transistor (TFT) 141 and an organic light-emitting diode (OLED) 142 are included in the display unit 140, as shown in FIG. 3. In more detail, an active layer 141$f$ can be formed on a buffer layer 141$a$ of the flexible substrate 130 and can include source and drain areas doped with relatively high concentration N or P type impurities. The active layer 141$f$ can be formed of an oxide semiconductor. For example, the oxide semiconductor can include an oxide selected from a material of Groups 12, 13, and 14 metal elements, such as zinc (Zn), indium (In), gallium (Ga), stannum (Sn), cadmium (Cd), germanium (Ge), or a combination thereof. For example, a semiconductor active layer 141$f$ can include I-G-Z-O [$(In_2O_3)a(Ga_2O_3)b(ZnO)c$], wherein a, b, and c are real numbers that respectively satisfy a≥0, b≥0, and c>0. A gate electrode 141$g$ can be formed on the active layer 141$f$ with a gate insulating film 141$b$ interposed therebetween. A source electrode 141$h$ and a drain electrode 141$i$ can be formed on the gate electrode 141g. An interlayer insulation film 141c can be provided between the gate electrode 141g and the source electrode 141h and the drain electrode 141i. A passivation film 141d can be interposed between the source electrode 141h and the drain electrode 141i and an anode electrode 142a of the OLED 142.

An insulating planarization film 141e can be formed of acryl or the like on the anode electrode 142a. An aperture 142d can be formed in the insulating planarization film 141e, and then, the OLED 142 can be formed.

The OLED 142 can display image information by emitting red, green and/or blue light as current flows therethrough. The OLED 142 can include the anode electrode 142a connected to the drain electrode 141i of the TFT 141 and receiving a positive power voltage from the drain electrode 141i, a cathode electrode 142c formed to cover the entire pixel and receiving a negative power voltage, and an emission layer 142b interposed between the anode electrode 142a and the cathode electrode 142c to emit light.

A hole injection layer (HIL), a hole transport layer (HTL), an electron transport layer (ETL), an electron injection layer (EIL), and the like can be stacked adjacent to the emission layer 142b.

For reference, the emission layer 142b can be separately formed on each pixel so that pixels emitting red, green, and blue light form a unit pixel. Alternatively, the emission layer 142b can be commonly formed over the entire pixel area regardless of locations of the pixels. In this regard, the emission layer 142b can be formed by vertically stacking or combining layers including light-emission materials that emit, for example, red light, green light, and blue light. Combinations of other colors may also be possible as long as white light can be emitted. A color converting layer or a color filter that converts the white light into a light of a predetermined color can be further provided.

Since the emission layer 142b may be very vulnerable to moisture, light-emission, the performance of the emission layer 142b may easily deteriorate when moisture is introduced into the display unit 140.

Thus, the thin film encapsulation layer 150, in which the organic film 152 and the inorganic film 152 are alternately stacked, can cover and protect the display unit 140.

Figure 4:
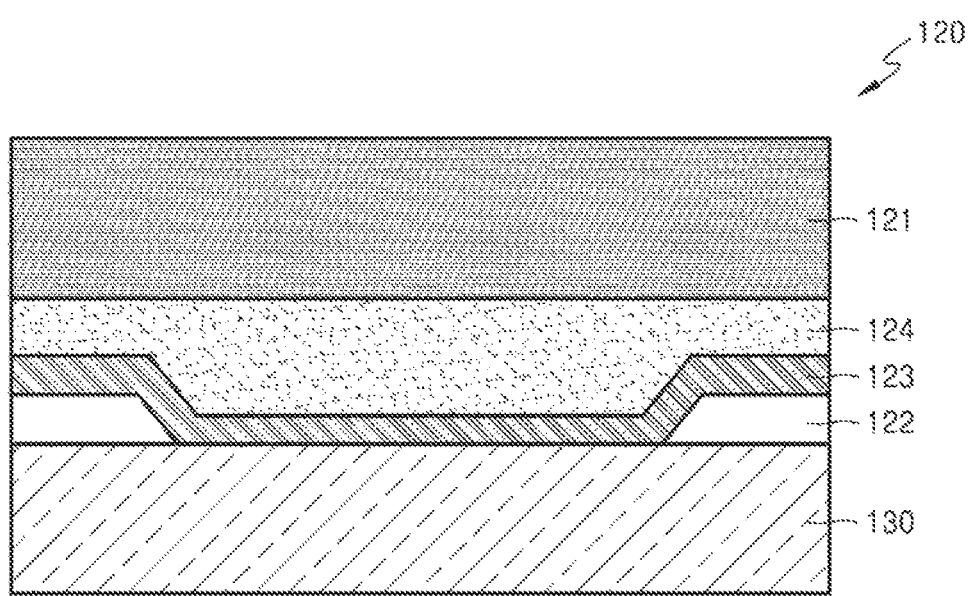
FIG. 4 is a sectional view of the bending area of FIG. 2.

FIG. 4 is a sectional view of the bending area of FIG. 2. The bending area 120 can have a cross-section structure as shown in FIG. 4. The wiring layer 123 which provide the path for the electrical signal(s) can be formed on the substrate 130. A first insulating film 122 and a second insulating film 124 can be respectively formed as upper and lower layers of the wiring layer 123. For example, the wiring layer 123 can be formed of the same material as that of the gate electrode 141g of the display unit 140 simultaneously with the gate electrode 141g. Similarly, the first insulating film 122 can be formed of the same material as that of the gate insulating film 141b of the display unit 140 simultaneously with the gate insulating film 141b. The second insulating film 124 can be formed of the same material as that of the planarizing film 141e of the display unit 140 simultaneously with the planarizing film 141e. The wiring layer 123 and the first insulating film 122 and the second insulating film 124 can be formed of different materials from those of the display unit 140 through different processes.

The stress-neutralizing layer 121 can be formed in the bending area 120 in which the wiring layer 123 and the first and second insulating films 122 and 124 are formed. The stress-neutralizing layer 121 can be formed of the same material as that of the organic film 152 of the thin film encapsulation layer 150 simultaneously with the organic film 152 through an inkjet process.

The flexible display panel having the above-described structure can be manufactured through a process of FIGS. 5A through 5D. In this regard, the wiring layer 123 and the first and second insulating films 122 and 124 are integrally formed as the wiring layer 123 as described with reference to FIG. 2 above.

Figure 5A:
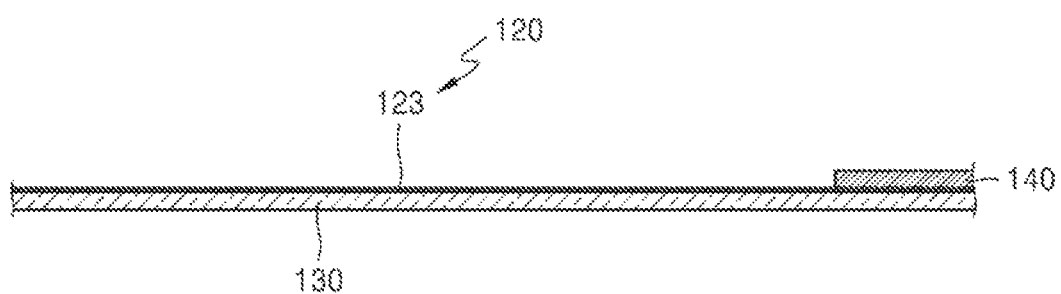
FIGS. 5A through 5D are diagrams for describing a method of manufacturing the flexible display panel of FIG. 1.

Referring to FIG. 5A, the display unit 140 can be formed on the flexible substrate 130, and the wiring layer 123 can be formed in the bending area 120. As described above, the wiring layer 123 can be formed simultaneously with an electrode and an insulating layer of the display unit 140 or can be formed separately from the display unit 140.

Figure 5B:
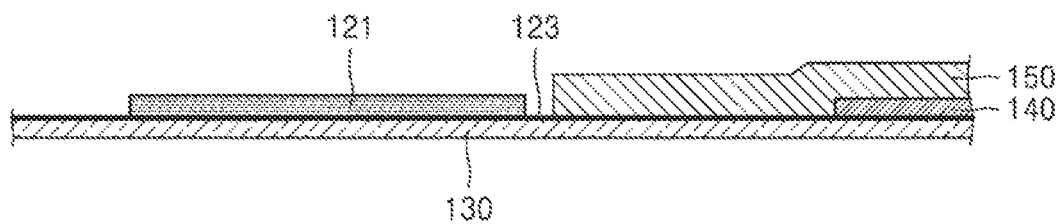

Thereafter, referring to FIG. 5B, the thin film encapsulation layer 150 can be formed on the display unit 140 and the stress-neutralizing layer 121 can be formed in the bending area 120. That is, when the organic film 152 of the thin film encapsulation layer 150 is formed using an inkjet, the same material as that of the organic film 152 can be sprayed to the bending area 120, thereby forming the stress-neutralizing layer 121 of the same material as that of the bending area 120. Thus, the stress-neutralizing layer 121 can be formed simultaneously with the organic film 152 of the thin film encapsulation layer 150 without having to perform an additional process for forming the stress-neutralizing layer 121.

Figure 5C:
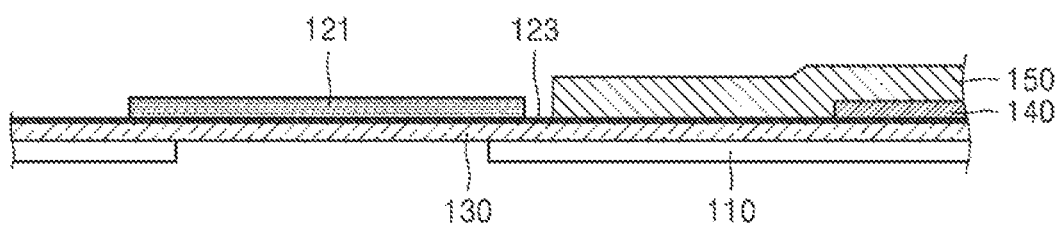
Figure 5D:
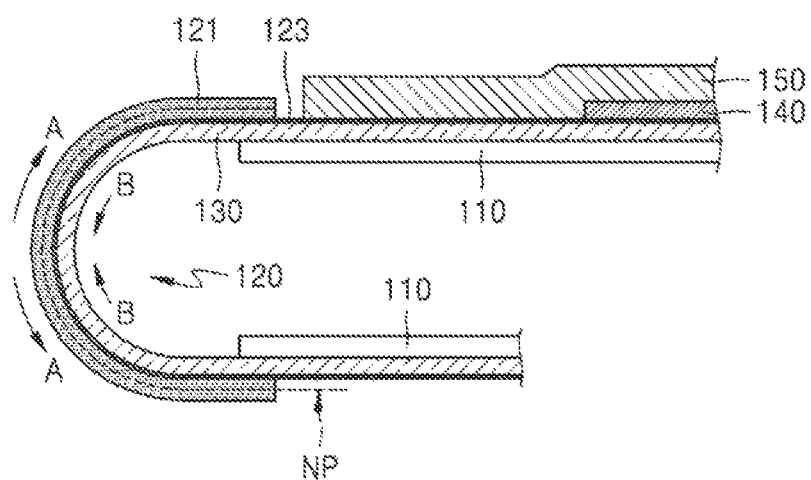

Thereafter, referring to FIG. 5C, if a protection film 110 is attached to the rear side of the substrate 130 and the bending area 120 is bent, referring to FIG. 5D, a flexible display panel that applies a compressive stress to the wiring layer 123 can be manufactured.

When the flexible display panel is manufactured through the above-described process, since the stress-neutralizing layer 121 is formed simultaneously with the thin film encapsulation layer 150 during one process, the entire process can be simplified, and, since the stress-neutralizing layer 121 is formed using the inkjet process, the stress-neutralizing layer 121 can be altered to have a desired thickness, and the location of the neutral surface NP can be easily neutralized (i.e., the neutral plane NP can be formed at a location within the stress-neutralizing layer 121).

Meanwhile, although the thin film encapsulation layer 150 is interposed between the organic film 152 and the inorganic film 151, the stack order or the number of layers can be different, and the thin film encapsulation layer 150 can be formed as a single layer of the organic film 152. In either embodiment, when the organic film 152 included in the thin film encapsulation layer 150 is formed, the stress-neutralizing layer 121 can be simultaneously formed.

As described above, according to the one or more of the above exemplary embodiments, the flexible display panel and the method of manufacturing the flexible display panel can quickly, conveniently, and accurately form a stress-neutralizing layer that prevents crack from occurring in a wiring layer, thereby effectively preventing the formation of cracks in the wiring layer while simplifying the manufacturing process.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been particularly shown and described with reference to exemplary embodiments thereof, it will be understood by those of ordinary skill in the art that various changes in form and details may be made therein without departing from the spirit and scope of the inventive technology as defined by the following claims.

What is claimed is:

1. A flexible display panel, comprising:
   a flexible substrate including a bending area;
   a display unit formed over the flexible substrate;
   a thin film encapsulation layer covering the display unit;
   a wiring layer electrically connected to the display unit and formed over the bending area; and
   a stress-neutralizing layer formed over the flexible substrate and configured such that a compressive stress is applied to the wiring layer when the bending area is bent,
   wherein the stress-neutralizing layer comprises a layer formed of the same material as the thin film encapsulation layer.

2. The flexible display panel of claim 1, wherein the thin film encapsulation layer comprises an organic film and wherein the stress-neutralizing layer comprises a layer formed of the same material as the organic film of the thin film encapsulation layer.

3. The flexible display panel of claim 2, wherein the thin film encapsulation layer further comprises an inorganic film alternately stacked with the organic film.

4. The flexible display panel of claim 1, wherein a neutral plane is located within the stress-neutralizing layer, wherein the neutral plane defines a boundary between tensile stress and compressive stress in the bending area when the bending area is bent.

5. The flexible display of claim 1, further comprising a protection film formed below the flexible substrate, wherein the protection film does not overlap the bending area.

6. The flexible display of claim 1, further comprising a pad unit formed over the flexible substrate, wherein the bending area is interposed between the pad unit and the display unit with respect to the length of the flexible substrate and wherein the bending area is bent such that the pad unit at least partially overlaps the display unit.

7. A method of manufacturing a flexible display panel, comprising:
   forming a display unit over a flexible substrate, wherein the display unit is configured to display an image;
   forming a wiring layer over a bending area of the flexible substrate, the wiring layer configured to transmit an electrical signal to the display unit;
   forming a thin film encapsulation layer so as to cover the display unit; and
   forming a stress-neutralizing layer over the wiring layer, wherein the stress-neutralizing layer is formed of the same material as the thin film encapsulation layer and wherein the stress-neutralizing layer is configured such that a compressive stress is applied to the wiring layer when the bending area is bent.

8. The method of claim 7, wherein the thin film encapsulation layer comprises an organic film, and wherein the stress-neutralizing layer comprises a layer formed of the same material as the organic film of the thin film encapsulation layer.

9. The method of claim 8, wherein the organic film of the thin film encapsulation layer and the stress-neutralizing layer are formed using an inkjet process.

10. The method of claim 8, wherein the thin film encapsulation layer further comprises an inorganic film alternately stacked with the organic film.

11. The method of claim 7, wherein a neutral plane is located within the stress-neutralizing layer, wherein the neutral plane defines a boundary between tensile stress and compressive stress in the bending area when the bending area is bent.

* * * * *